(12) United States Patent
Askan

(10) Patent No.: US 10,998,708 B2
(45) Date of Patent: May 4, 2021

(54) LOW-VOLTAGE PROTECTION DEVICE

(71) Applicant: EATON INTELLIGENT POWER LIMITED, Dublin (IE)

(72) Inventor: Kenan Askan, Vienna (AT)

(73) Assignee: EATON INTELLIGENT POWER LIMITED, Dublin (IE)

( * ) Notice: Subject to any disclaimer, the term of this patent is extended or adjusted under 35 U.S.C. 154(b) by 110 days.

(21) Appl. No.: 16/479,976

(22) PCT Filed: Jan. 25, 2018

(86) PCT No.: PCT/EP2018/051766
§ 371 (c)(1),
(2) Date: Jul. 23, 2019

(87) PCT Pub. No.: WO2018/138175
PCT Pub. Date: Aug. 2, 2018

(65) Prior Publication Data
US 2019/0341764 A1    Nov. 7, 2019

(30) Foreign Application Priority Data
Jan. 25, 2017 (DE) ..................... 10 2017 101 452.7

(51) Int. Cl.
*H02H 3/00* (2006.01)
*H02H 3/02* (2006.01)
(Continued)

(52) U.S. Cl.
CPC .......... *H02H 3/021* (2013.01); *H02H 1/0007* (2013.01); *H02H 3/093* (2013.01)

(58) Field of Classification Search
None
See application file for complete search history.

(56) References Cited

U.S. PATENT DOCUMENTS 5,559,656 A   9/1996   Chokhawala
5,652,688 A   7/1997   Lee
(Continued)

FOREIGN PATENT DOCUMENTS

DE   69808044 T2   2/2003
EP   2482409 A2   8/2012
(Continued)

OTHER PUBLICATIONS

Anonymous, "Database WPI", *Thomson Scientific Week* 201706 (Dec. 28, 2016). XP002780108.

*Primary Examiner* — Stephen W Jackson
(74) *Attorney, Agent, or Firm* — Leydig, Voit & Mayer, Ltd.

(57) ABSTRACT

A low-voltage protective device includes: at least one outer conductor path from an outer conductor power terminal of the low-voltage protective device to an outer conductor load terminal of the low-voltage protective device; a neutral conductor path from a neutral conductor terminal of the low-voltage protective device to a neutral conductor load terminal of the low-voltage protective device; a mechanical bypass switch arranged in the outer conductor path; a first semiconductor circuit arrangement connected in parallel to the mechanical bypass switch, the first semiconductor circuit arrangement having at least one power semiconductor, such as an IGBT, with a control terminal, such as a gate terminal; an electronic control unit; a current-measurement arrangement arranged in the outer conductor path, connected to the electronic control unit of the protective device; and at least one voltage measurement arrangement for detecting a Miller effect-induced voltage spike at the at least one power semiconductor.

10 Claims, 2 Drawing Sheets

(51) Int. Cl.
*H02H 1/00* (2006.01)
*H02H 3/093* (2006.01)

(56) References Cited

U.S. PATENT DOCUMENTS

| | | | |
|---|---|---|---|
| 6,160,693 A | 12/2000 | Sairanen | |
| 9,590,619 B2 * | 3/2017 | Kittile | H03K 17/0812 |
| 9,722,581 B2 * | 8/2017 | Zhao | H03K 3/012 |
| 9,838,002 B2 * | 12/2017 | Xu | H02M 1/08 |
| 10,707,029 B2 * | 7/2020 | Askan | H02H 3/08 |
| 2003/0180997 A1 | 9/2003 | Nakayama et al. | |
| 2017/0098931 A1 | 4/2017 | Gerdinand et al. | |

FOREIGN PATENT DOCUMENTS

| | | |
|---|---|---|
| WO | WO 2015028634 A1 | 3/2015 |
| WO | WO 2015192924 A1 | 12/2015 |

\* cited by examiner

US 10,998,708 B2

LOW-VOLTAGE PROTECTION DEVICE

CROSS-REFERENCE TO PRIOR APPLICATIONS

This application is a U.S. National Phase application under 35 U.S.C. § 371 of International Application No. PCT/EP2018/051766, filed on Jan. 25, 2018, and claims benefit to German Patent Application No. DE 10 2017 101 452.7, filed on Jan. 25, 2017. The International Application was published in German on Aug. 2, 2018 as WO 2018/138175 under PCT Article 21(2).

FIELD

The invention relates to a low-voltage protective device.

BACKGROUND

A corresponding protective device is known from WO 2015/028634 A1 of the applicant. When the protective device is switched off, first the bypass switch is opened, such that an arc occurs and the current commutates to the semiconductor circuit arrangement. Subsequently, the previously energized semiconductor circuit arrangement is switched off and the break contacts are opened to provide galvanic isolation. These break contacts are connected in series with the bypass switch.

When a short-circuit current is interrupted, it is important that the contacts of the bypass switch are opened far enough that an no arc is ignited at the contacts of the bypass switch when the short-circuit current is interrupted. At the same time, however, the short-circuit current should be interrupted as quickly as possible in order to minimize the load in the downstream network, as well as in the semiconductor circuit arrangement. With an early and/or rapid interruption of the short-circuit current, it is possible to interrupt the current in the rising phase, even before it reaches its maximum amplitude determined by the internal resistance of the supply network, as well as the resistance of the downstream network—thereby making it possible to further minimize the load on the network and devices.

Activating the bypass switch electrically and/or electromagnetically, so that its contacts open, is a known practice. A timer is started at the same time. It is assumed in this case that after a certain period of time, the contacts of the bypass switch are opened wide enough that they can safely interrupt the short-circuit current, and they have assumed a sufficiently stable and/or static state. This period of time must be adapted with safety factors to ensure that the contacts of the bypass switch are actually opened widely enough. These safety factors must be both of the necessary size and accordingly sufficient—due to significant variations in the opening behavior of mechanical switches. The result is late interruption of the short-circuit current and a correspondingly high load on the network and the semiconductor circuit arrangement.

SUMMARY

In an embodiment, the present invention provides a low-voltage protective device, comprising: at least one outer conductor path from an outer conductor power terminal of the low-voltage protective device to an outer conductor load terminal of the low-voltage protective device; a neutral conductor path from a neutral conductor terminal of the low-voltage protective device to a neutral conductor load terminal of the low-voltage protective device; a mechanical bypass switch arranged in the outer conductor path; a first semiconductor circuit arrangement connected in parallel to the mechanical bypass switch, the first semiconductor circuit arrangement having at least one power semiconductor, comprising an IGBT, with a control terminal, comprising a gate terminal; an electronic control unit; a current-measurement arrangement arranged in the outer conductor path, connected to the electronic control unit of the protective device; and at least one voltage measurement arrangement configured to detect a Miller effect-induced voltage spike at the at least one power semiconductor, wherein the electronic control unit is configured to activate the mechanical bypass switch and the first semiconductor circuit arrangement if the current measurement arrangement detects a prespecifiable overcurrent.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

In an embodiment, the present invention provides a low-voltage protective device of the type named at the outset, with which the mentioned disadvantages can be avoided, and with which the short-circuit load can be minimized for the low-voltage protective device itself and for the electrical network to be protected.

As such, the time point at which the contacts of the bypass switch actually start to open can be detected very accurately, and can be used for controlling the semiconductor circuit arrangement.

In the present invention, the influence of the arc voltage on the so-called Miller effect is utilized to detect whether the bypass relay has opened or not under the conditions of an electrical fault. When the bypass switch 8 opens, an arc is formed, and the voltage at the contacts rises very rapidly to the arc voltage. The slew rate can be a few hundred volts per microsecond. The power semiconductor is already energized in this case. If the power semiconductor is designed as an IGBT, this voltage change causes a charge reversal of the gate-collector capacitance, resulting in an easily perceptible increase in the gate voltage. This increase can be exploited to detect whether the contacts of the bypass switch have moved to open.

The bypass switch is a mechanical switch. The opening of the mechanical contacts of this switch is never exactly equal to a previous opening of the same bypass switch or another, similar bypass switch. In conventional low-voltage protective devices, this behavior must be taken into account by appropriate compensating measures. It has been found that during the opening process, the initial phase of the contact opening—that is, the period from the electrical actuation of the bypass switch to the time at which an actual opening of the contacts begins, i.e., when a first movement of the movable contacts actually takes place—is particularly the phase of the entire switching process of the bypass switch which causes the greatest temporal variation. The subsequent phase of the contact opening, in which the movable contacts are already in motion, and only have to travel through the remaining opening path, has proven to be relatively constant.

With the present measures, the time point of the actual contact opening at the bypass switch can be detected, and can serve as a starting point for a timer, which can then count, starting from this time point, a very precise, known time span to a complete opening of the contacts. This timer can work with much less time-relevant compensating measures. As a result, the short-circuit current can be switched off at a time when this is technically possible without exposing the network and the semiconductor circuit arrangement to further loading by the short-circuit current.

Figure 1:
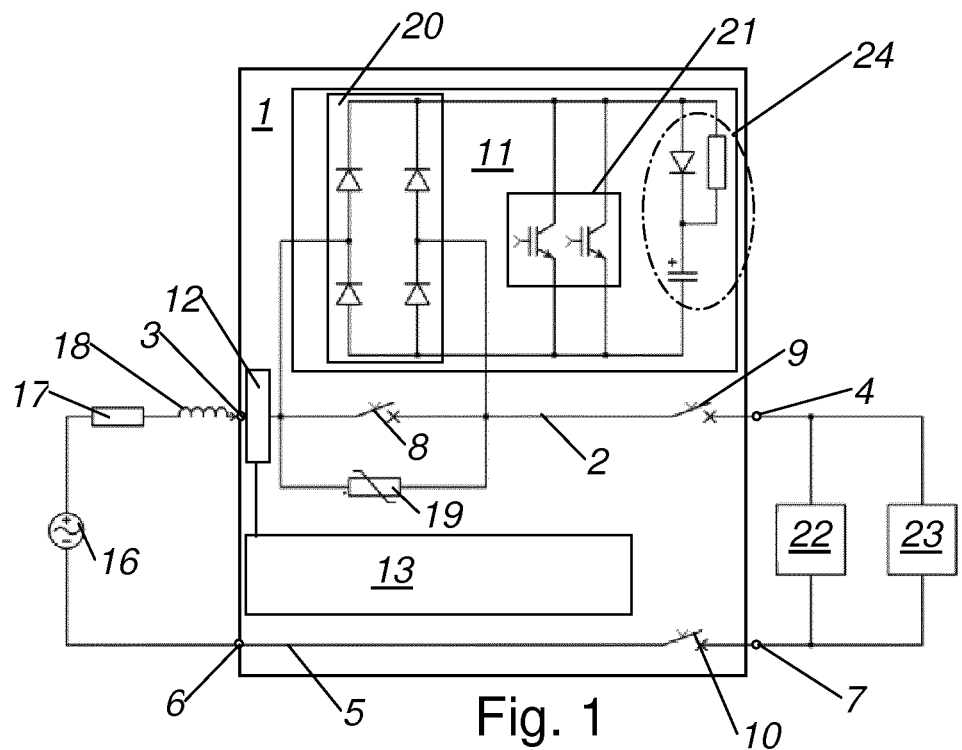
FIG. 1 shows a first protective device according to the prior art.

FIG. 1 shows a preferred embodiment of a low-voltage protective device 1 having at least one outer conductor path 2 from an outer conductor power terminal 3 of the low-voltage protective device 1 to an outer conductor load terminal 4 of the low-voltage protective device 1, and a neutral conductor path 5 from a neutral conductor terminal 6 of the low-voltage protective device 1 to a neutral conductor load terminal 7 of the low-voltage protective device 1, wherein a mechanical bypass switch 8 is arranged in the outer conductor path 2, wherein a semiconductor circuit arrangement 11 of the low-voltage protective device 1 is connected in parallel to the bypass switch 8, wherein the semiconductor circuit arrangement 11 has at least one power semiconductor 21, in particular an IGBT, with a control terminal, in particular a gate terminal, wherein a current-measurement arrangement 12 is arranged in the outer conductor path 2, connected to an electronic control unit 13 of the protective device 1, wherein the electronic control unit 13 is designed to activate the bypass switch 8 and the semiconductor circuit arrangement 11 if the current measurement arrangement 12 detects a prespecifiable overcurrent, in particular a short-circuit current.

Figure 2:
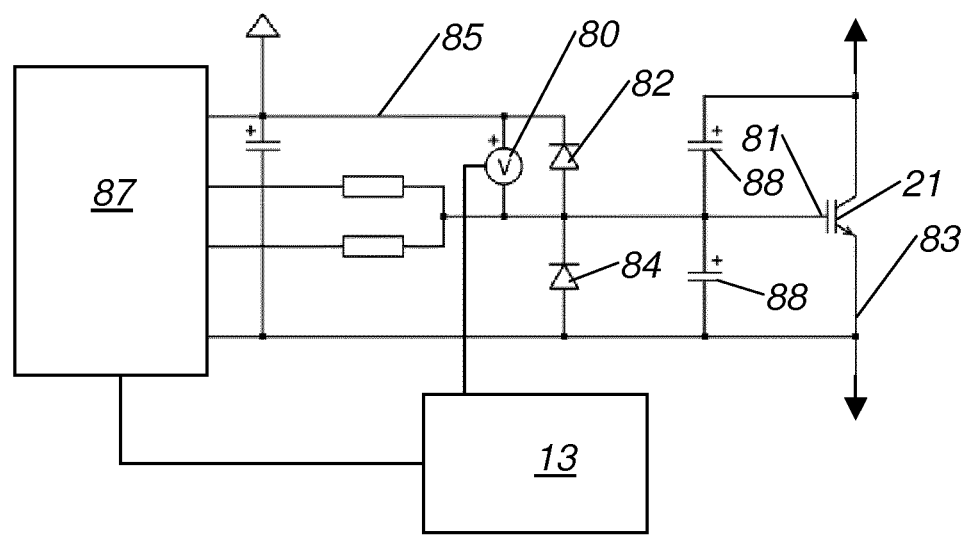
FIG. 2 shows a first embodiment of a circuit arrangement of a low-voltage protective device according to the invention.
Figure 3:
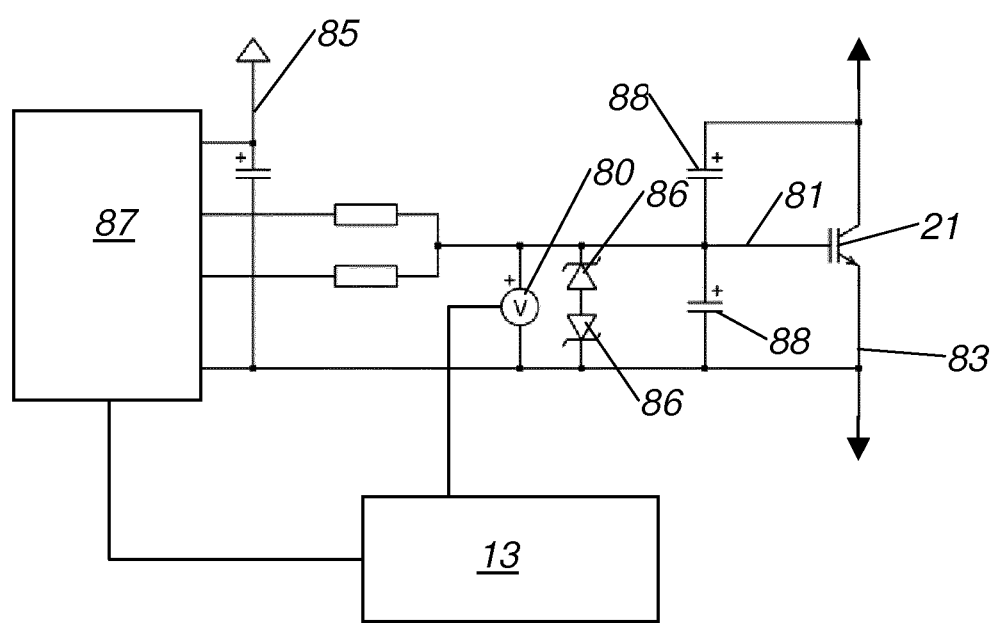
FIG. 3 shows a second embodiment of a circuit arrangement of a low-voltage protective device according to the invention.

FIGS. 2 and 3 each show different embodiments of a circuit arrangement of a low-voltage protective device 1, having at least one voltage measurement arrangement 80 for detecting a Miller effect-induced voltage spike—that is, a voltage spike and/or voltage increase due to the so-called Miller effect—in the at least one power semiconductor 21 of the first semiconductor circuit arrangement 11. The corresponding voltage peak is therefore generated in the power semiconductor path 21 and/or its—particularly parasitic—capacitances, but can be absorbed at any point of the low-voltage protective device 1 where it can be detected.

As a result, the time point at which the contacts of the bypass switch 8 actually start to open can be detected very precisely, and used to control the semiconductor circuit arrangement 11.

When the bypass switch 8 opens, an arc is formed. As a result of the potential difference at the arc, there is a current flow. Due to the so-called Miller effect, when current first flows through the power semiconductor 21, which is particularly an IGBT or a MOSFET, there is a significant and very short voltage spike. Because the first flow of current via the power semiconductor 21 begins as a result of the arc at the start of the opening of the contacts of the bypass switch 8, said voltage peak coincides with the actual start of the opening of the bypass switch 8.

The bypass switch 8 is a mechanical switch. The opening of the mechanical contacts of this switch is never exactly the same as a previous opening of the same bypass switch 8 or another similar bypass switch 8. This behavior must be taken into account in conventional low-voltage protective devices 1 by appropriate compensating measures. It has been found that during the opening process, the initial phase of the contact opening—that is, the period from the electrical actuation of the bypass switch 8 to the time at which an actual opening of the contacts begins, i.e., when a first movement of the movable contacts actually takes place—is particularly the phase of the entire switching process of the bypass switch 8 which causes the greatest temporal variation. The subsequent phase of the contact opening, in which the movable contacts are already in motion, and only have to travel through the remaining opening path, has proven to be relatively constant.

With the present measures, the time point of the actual contact opening at the bypass switch 8 can be detected, and can serve as a starting point for a timer, which can then count, starting from this time point, a very precise, known time span to a complete opening of the contacts. This timer can work with much less time-relevant compensating measures. As a result, the short-circuit current can be switched off at a time when this is technically possible without exposing the network and the semiconductor circuit arrangement 11 to further loading by the short-circuit current.

Because a short circuit is de-energized more quickly, power semiconductors 20, 21 with lower maximum loads can then be used in the semiconductor circuit arrangement 11. Such power semiconductors 20, 21 have both a lower internal resistance and a smaller physical size than power semiconductors 20, 21 which can withstand a higher load. Due to the smaller size, in particular the shorter paths within the power semiconductor 21, the relevant loop inductance of the low-voltage protective device 1 is reduced, such that the commutation time of the short-circuit current to the semiconductor circuit arrangement 11 can be directly further reduced. The lower internal resistance further reduces the commutation time.

By quickly de-energizing a short-circuit or overload current, less energy is stored than otherwise in the form of leakage inductances and/or in the network inductance, thereby protecting the surge arrester 19 and the snubber 24. These can also be made smaller.

The present low-voltage protective device 1, as well as the protective device according to WO 2015/028634 A1, are low-voltage protective devices. Low voltage is considered to mean, as usual, the range up to 1000V AC voltage and/or 1500V DC voltage.

FIG. 1 shows a protective device according to the prior art, as described in WO 2015/028634 A1, for example. It has an outer conductor path 2 and a neutral conductor path 5. The outer conductor path 2 runs through the protective device 1 from an outer conductor power terminal 3 to an outer conductor load terminal 4. The neutral conductor path 5 runs through the protective device 1 from a neutral conductor terminal 6 to a neutral conductor load terminal 7. The respective terminals 3, 4, 6, 7 are each designed as screw terminals and/or plug-in terminals, and are arranged in the protective device 1 allowing access from the outside.

The protective device 1 preferably has a housing made of an insulating material. A mechanical bypass switch 8 is arranged in the outer conductor path 2. Furthermore, a surge arrester 19 is connected in parallel to the bypass switch 8.

In the outer conductor path 2, a first mechanical isolating switch 9 is furthermore arranged in series with the bypass switch 8. A second mechanical isolating switch 10 is arranged in the neutral conductor path 5. A semiconductor circuit arrangement 11 is connected in parallel to the bypass switch 8.

The protective device 1 further comprises a current measurement arrangement 12, which is arranged in the outer conductor path 2 and which is preferably designed comprising a shunt resistor.

The current measurement arrangement 12 is connected to an electronic control unit 13 of the protective device 1, which is preferably designed comprising a microcontroller and/or microprocessor. The electronic control unit 13 is designed to control the bypass switch 8 and the first semiconductor circuit arrangement 11, as well as the first mechanical isolating switch 9 and the second mechanical isolating switch 10, and therefore to actuate and/or switch them in a prespecifiable manner. For this purpose, the electronic control unit 13 is connected to the semiconductor circuit arrangement 11, and also to the—particularly electromagnetic—actuating elements of the mechanical switches, i.e., the bypass switch 8, the first mechanical isolating switch 9 and the second mechanical isolating switch 10, preferably in a circuit. The corresponding connections starting from the electronic control unit 13 are not shown.

The semiconductor circuit arrangement 11 preferably has a rectifier circuit 20, which is preferably designed as a full bridge, and, in the present embodiment, two power semiconductors 21, which are designed in this case as IGBTs, as actual switching elements and/or control elements. In this case, a single larger power semiconductor 21 may be provided.

In FIG. 1, the electrical environment is indicated in addition to the actual protective device 1. The supply network is represented by the AC/DC power grid voltage source 16, the internal network resistance 17 and the grid inductance 18. Furthermore, an electrical load 23 and an electrical fault 22 in the form of a short circuit are shown.

In a switching device according to FIG. 1, a de-energizing process is carried out by the bypass switch 8 and the semiconductor circuit arrangement 11, and the first and second isolating switches 9, 10 only serve to ensure a galvanic isolation of the load circuit after the de-energizing.

A low-voltage protective device 1 according to the invention preferably corresponds to a low-voltage protective device according to FIG. 1 in regards to all other features, such as those shown in FIGS. 2 and 3. In two-pole versions of a low-voltage protective device 1 according to the invention, the path designated as the neutral conductor path 5 and/or the circuit connection through the low-voltage protective device 1 is designed and/or must be designed corresponding to the outer conductor path 2 described above.

The low-voltage protective device 1 has at least one voltage measurement arrangement 80 for detecting a Miller effect-induced voltage spike in the at least one power semiconductor 21 of the first semiconductor circuit arrangement 11.

In this case, the voltage measurement arrangement 80 for measuring a control connection voltage can be constructed on the at least one power semiconductor 21 and/or arranged correspondingly in the low-voltage protective device 1. In the preferred embodiment of the power semiconductor 21 as an IGBT, the control terminal is the so-called gate connection. In this case, the gate voltage is measured. If the power semiconductor 21 is designed as a MOSFET, the so-called gate voltage would also be measured as the control terminal voltage.

The voltage measurement arrangement 80 is preferably connected to the electronic control unit 13.

As already stated, the voltage measurement arrangement 80 serves to detect a voltage peak which arises due to the Miller effect. Accordingly, the control unit 13 and/or the voltage measurement arrangement 80 are preferably designed accordingly to detect a specifiable voltage peak occurring after the output of a bypass switch opening signal. In this context, the voltage measurement arrangement 80 preferably has a correspondingly high time resolution in order to detect a peak. In the preferred digital embodiment of the control unit 13 and/or the voltage measurement arrangement 80, an analog voltage signal is preferably digitally detected with a sampling rate of at least 20 kHz, preferably 40 kHz.

Because the voltage peak being detected only occurs at a very specific point in time, and/or is expected and evaluated at a very specific point in time, namely after the bypass switch 8 has been activated to open the contacts, the voltage measurement arrangement 80 can be in operation only during this process, and the control unit 13 can be designed accordingly. This makes it possible to keep the power consumption and the self-heating of the low-voltage protective device 1 low.

However, it has proved to be advantageous for the overall operation of the low-voltage protective device 1 if the voltage measurement arrangement 80 substantially constantly monitors the corresponding voltage. In this way, the control unit 13 can monitor the function of the power semiconductor 21 to determine whether it is turned on or functioning.

The control unit 13 preferably has a timer which is started upon detection of the voltage peak, and the control unit 13 is preferably designed to output a switch-off signal to the first semiconductor circuit arrangement 11 after the timer runs out. In this way, the time to de-energizing a short-circuit current can be reduced, as already stated above.

The control unit 13 can also further comprise a comparison and/or analysis unit which is designed to examine a voltage spike to determine whether it is actually a specifiable and/or expected voltage spike resulting from the Miller effect. In this case, methods which are known from the field of arc detectors can be used and/or adapted.

FIG. 2 shows a first embodiment of a circuit arrangement of a low-voltage protective device 1 according to the invention. A first bypass diode 82 is connected between the control terminal 81 of the power semiconductor 21 and a supply voltage terminal 85, and a second bypass diode 84 is connected between the control terminal 81 of the power semiconductor 21 and a ground terminal 83 of the power semiconductor 21. The bypass diodes 82, 84 serve primarily to protect the power semiconductor 21. The first bypass diode 82 also enables the decrease of a voltage for which a corresponding voltage peak can also be detected as a result of the Miller effect, which is why the voltage measurement arrangement 80 is preferably arranged in the circuit parallel to the first bypass diode 82.

The circuit arrangement according to FIGS. 2 and 3 furthermore has two capacitors 88 in order to optionally increase the Miller effect, and thus to cause a more clearly-detectable voltage peak. However, the two capacitors 88 may also be purely parasitic capacitances.

FIG. 3 shows a second embodiment of a circuit arrangement of a low-voltage protective device 1 according to the invention. In the embodiment according to FIG. 3, the control terminal voltage, in particular the gate voltage, is measured at the at least one power semiconductor 21 of the semiconductor circuit arrangement 11.

In the embodiment according to FIG. 3, two anti-serially arranged Zener diodes 86 are connected between the control terminal 81 of the power semiconductor 21 and a ground terminal 83 of the power semiconductor 21, likewise serving primarily to protect the power semiconductor 21. The voltage measurement arrangement 80 is arranged in the circuit parallel to the two Zener diodes 86.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A low-voltage protective device, comprising:
   at least one outer conductor path from an outer conductor power terminal of the low-voltage protective device to an outer conductor load terminal of the low-voltage protective device;
   a neutral conductor path from a neutral conductor terminal of the low-voltage protective device to a neutral conductor load terminal of the low-voltage protective device;
   a mechanical bypass switch arranged in the outer conductor path;
   a first semiconductor circuit arrangement connected in parallel to the mechanical bypass switch, the first semiconductor circuit arrangement having at least one power semiconductor, comprising an IGBT, with a control terminal, comprising a gate terminal;
   an electronic control unit;
   a current-measurement arrangement arranged in the outer conductor path, connected to the electronic control unit of the protective device; and
   at least one voltage measurement arrangement configured to detect a Miller effect-induced voltage spike at the at least one power semiconductor,
   wherein the electronic control unit is configured to activate the mechanical bypass switch and the first semiconductor circuit arrangement if the current measurement arrangement detects a prespecifiable overcurrent.

2. The low-voltage protective device according to claim 1, wherein the voltage measurement arrangement is connected to the electronic control unit.

3. The low-voltage protective device according to claim 2, wherein the electronic control unit and/or the voltage measurement arrangement is configured to detect a specifiable voltage peak occurring after an output of a bypass switch opening signal.

4. The low-voltage protective device according to claim 3, wherein the electronic control unit has comprises a timer which is started with detection of the voltage peak, and
   wherein the electronic control unit is configured to output a switch-off signal to the first semiconductor circuit arrangement after the timer runs out.

5. The low-voltage protective device according to claim 1, further comprising a first bypass diode connected between a control terminal of the at least one power semiconductor and a supply voltage terminal.

6. The low-voltage protective device according to claim 5, wherein the voltage measurement arrangement is arranged in the circuit parallel to the first bypass diode.

7. The low-voltage protective device according to claim 1, further comprising two anti-serially arranged Zener diodes connected between a control terminal of the at least one power semiconductor and a ground terminal of the at least one power semiconductor.

8. The low-voltage protective device according to claim 7, wherein the voltage measurement arrangement is arranged in the circuit parallel to the two Zener diodes.

9. The low-voltage protective device according to claim 1, further comprising a snubber connected parallel to the at least one power semiconductor.

10. The low-voltage protective device according to claim 1, wherein the prespecifiable overcurrent is a short-circuit current.

* * * * *